(12) United States Patent
Akiyama

(10) Patent No.: US 7,611,994 B2
(45) Date of Patent: Nov. 3, 2009

(54) FINE PATTERNING METHOD FOR SEMICONDUCTOR DEVICE

(75) Inventor: Kazutaka Akiyama, Matsudo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 263 days.

(21) Appl. No.: 11/393,718

(22) Filed: Mar. 31, 2006

(65) Prior Publication Data

US 2006/0240639 A1 Oct. 26, 2006

(30) Foreign Application Priority Data

Mar. 31, 2005 (JP) ............................. 2005-104874

(51) Int. Cl.
*H01L 21/302* (2006.01)

(52) U.S. Cl. .................. 438/717; 438/445; 438/736; 257/E21.023

(58) Field of Classification Search ............... 438/445, 438/717, 736; 257/E21.023
See application file for complete search history.

(56) References Cited

U.S. PATENT DOCUMENTS

| 6,497,996 | B1   | 12/2002 | Naya et al.          |         |
|-----------|------|---------|----------------------|---------|
| 6,814,879 | B2   | 11/2004 | Shibata              |         |
| 6,846,750 | B1 * | 1/2005  | Ohiwa et al. ........ | 438/739 |
| 7,186,656 | B2 * | 3/2007  | Sreenivasan ........  | 438/700 |
| 2002/0061453 | A1 * | 5/2002 | Sato et al. .......... | 430/5 |
| 2004/0183162 | A1 * | 9/2004 | Ohto et al. ......... | 257/635 |
| 2006/0115772 | A1 * | 6/2006 | Hah et al. .......... | 430/311 |

FOREIGN PATENT DOCUMENTS

| JP | 2000-3029   | 1/2000 |
| JP | 2000-164701 | 6/2000 |
| JP | 2001-92154  | 4/2001 |
| JP | 2002-110510 | 4/2002 |

OTHER PUBLICATIONS

Notice of Reasons for Rejection mailed Jul. 8, 2008, from the Japanese Patent Office in counterpart Japanese Application No. 2005-104874.

* cited by examiner

*Primary Examiner*—Asok K Sarkar
*Assistant Examiner*—Julia Slutsker
(74) *Attorney, Agent, or Firm*—Finnegan, Henderson, Farabow, Garrett & Dunner, L.L.P.

(57) ABSTRACT

An insulation film is formed on a semiconductor substrate. A stopper film, which has a large etching selectivity relative to the insulation film and has a first film thickness, is formed on the insulation film. A first mask material, which has a second film thickness that is less than the first film thickness, is formed on the stopper film. A first mask is formed by patterning the first mask material. An opening portion is formed by etching the stopper film using the first mask. The opening portion is filled with a second mask material. A second mask of the second mask material is formed by removing the stopper film. The insulation film is etched using the second mask.

20 Claims, 6 Drawing Sheets

FINE PATTERNING METHOD FOR SEMICONDUCTOR DEVICE

CROSS-REFERENCE TO RELATED APPLICATIONS

This application is based upon and claims the benefit of priority from prior Japanese Patent Application No. 2005-104874, filed Mar. 31, 2005, the entire contents of which are incorporated herein by reference.

BACKGROUND OF THE INVENTION

1. Field of the Invention

The present invention relates generally to a method of manufacturing a semiconductor device, and more particularly to a patterning method for microfabrication.

2. Description of the Related Art

For example, when an insulation film on a substrate, which is formed of a silicon wafer, is to be etched, a photoresist is coated on the insulation film. The photoresist is patterned by an exposure device to form a resist pattern. Using the resist pattern as a mask, the insulation film is subjected to anisotropic etching (e.g. reactive ion etching (RIE)). With the development in fine patterning of semiconductor devices, the thickness of the resist has been decreasing more and more, and it has become difficult to etch a thick insulation film.

In the case of patterning a resist using an exposure device, general methods for securing a focus margin for fine patterning include decreasing the exposure wavelength and increasing the sensitivity of the resist. These methods, however, are not sufficient, and it is necessary to decrease the thickness of the resist. However, if the thickness of the resist is decreased, it is not possible to deeply etch the insulation film. In addition, if the insulation film is forcibly etched to a great depth using a thin resist film, the insulation film cannot be etched with design dimensions because of the deficiency in thickness of the resist.

On the other hand, in order to decrease the capacitance between wiring lines, a porous film is, in some cases, used as an insulation film. For example, when a trench is formed in the porous insulation film, damage may easily occur on the inner wall surface of the trench and an SiCH film tends to change into a $SiO_2$-based film. If the SiCH film changes into the $SiO_2$-based film, the capacitance between wiring lines may increase due to the denaturing of the film, or the denatured film portion may be removed by wet treatment and the line width may increase, leading to a higher capacitance between wiring lines.

As a method for solving these problems, there is known an etching method using a hard mask. In this method, for example, a hard mask material is formed on an insulation film. A resist pattern is once transferred to the hard mask material, thereby forming a hard mask. Using the hard mask as a mask, the insulation film is etched.

However, there is a case where the resist pattern is transferred to the hard mask material such that the width dimension of the hard mask may become smaller than that of the resist pattern. In this case, if the insulation film is etched in this state, a trench with a great width is formed, and such a problem arises that a pattern having dimensions different from the design dimensions would be formed.

In the case where the etching rate (E/R) of the insulation film, relative to the hard mask, is small, the thickness of the insulation film is limited, relative to the thickness of the hard mask. Specifically, an opening portion in the hard mask is etched to spread laterally, and similarly an opening portion in the insulation film is etched to spread laterally and has a pattern with dimensions different from the design dimensions. To avoid this problem, it is necessary to optimize the conditions for etching the insulation film and to increase the E/R of the insulation film, relative to the hard mask.

For example, in the case where an $SiO_2$ film, which is represented by TEOS, is used as an insulation film, an SiN film or an SiC film, which has a high etching selectivity, is generally used as a hard mask. However, the etching selectivity of SiN or SiC to $SiO_2$ is about 2 to 10 at most even when etching is performed under the condition of a CF-based gas in order to set the etching selectivity at a high value. Besides, there is a need to consider a dimension conversion error due to forming the hard mask. Thus, if necessary, the initial dimensions of the resist pattern have to be greatly varied, relative to the final dimensions.

As regards a porous insulation film that is used in order to lower the inter-line capacitance, there is known an etching method using a hard mask. In this case, it is desirable to use TEOS for the hard mask. However, in this case, too, there is a need to consider a dimension conversion error due to forming the hard mask. Thus, like the above-described case, if necessary, the initial dimensions of the resist pattern have to be greatly varied, relative to the final dimensions.

On the other hand, there is a method in which a resist pattern is transferred not to a hard mask, but to an organic film that is typified by a non-photosensitive resist film. When the non-photosensitive resist film is used, a etching selectivity of 10 or more to $SiO_2$ can be secured. However, in the case where the non-photosensitive resist film is used for the mask material, when the non-photosensitive resist film itself is processed, it is necessary to first process a material, other than the resist, into a mask. In general, an $SiO_2$-based material is used as an example of the mask material of the non-photosensitive resist. It is difficult, however, to form a fine pattern with this material by lithography. It is thus difficult to use the non-photosensitive resist as mask material.

There is known a similar method in which a resist pattern is filled with an organic silicon compound. After the organic silicon compound, which is present at locations other than spaces in the resist pattern, is removed, the resist is removed. Thereby, a pattern of the organic silicon compound is formed (see, e.g. Jpn. Pat. Appln. KOKAI Publication No. 2001-92154, Jpn. Pat. Appln. KOKAI Publication No. 2000-3029 and Jpn. Pat. Appln. KOKAI Publication No. 2002-110510). However, in this method, an organic silicon compound, which has a film thickness greater than the thickness of the initial resist pattern, cannot be formed.

BRIEF SUMMARY OF THE INVENTION

According to an aspect of the present invention, there is provided a method of manufacturing a semiconductor device, comprising: forming an insulation film on a semiconductor substrate; forming a stopper film on the insulation film, the stopper film having a large etching selectivity relative to the insulation film and having a first film thickness; forming a first mask material on the stopper film, the first mask material having a second film thickness that is less than the first film thickness; forming a first mask by patterning the first mask material; forming an opening portion by etching the stopper film using the first mask; filling the opening portion with a second mask material; forming a second mask of the second mask material by removing the stopper film; and etching the insulation film using the second mask.

BRIEF DESCRIPTION OF THE SEVERAL VIEWS OF THE DRAWING

FIG. 1A to FIG. 1F schematically illustrate fabrication steps of a manufacturing method of a semiconductor device according to an embodiment of the present invention;

FIG. 2A to FIG. 2E schematically illustrate fabrication steps of a manufacturing method of a semiconductor device according to a modification of the embodiment shown in FIG. 1A to FIG. 1F;

FIG. 3A to FIG. 3F illustrate a manufacturing method of a semiconductor device according to a first example of the invention;

FIG. 4A to FIG. 4F illustrate a manufacturing method of a semiconductor device according to a second example of the invention;

FIG. 5A to FIG. 5D illustrate a manufacturing method of a semiconductor device according to a first comparative example; and FIG. 6A to FIG. 6D illustrate a manufacturing method of a semiconductor device according to a third comparative example.

DETAILED DESCRIPTION OF THE INVENTION

An embodiment of the present invention will now be described with reference to the accompanying drawings.

Figure 1A:
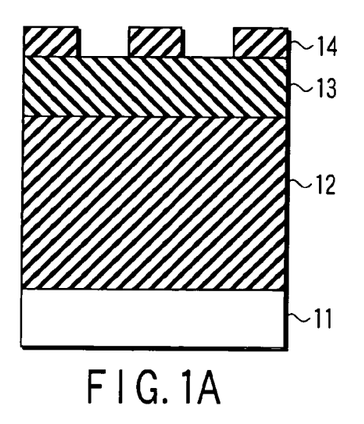

To begin with, the outline of the present invention is explained with reference to FIG. 1A to FIG. 1F. As is shown in FIG. 1A, for example, an insulation film 12 is formed on a silicon substrate 11, and a stopper film 13 having a high etching selectivity to the insulation film 12 is formed on the insulation film 12. The etching rate of the stopper film 13 is set to be, e.g. ten times as high as the etching rate of the insulation film 12. A first resist 14, which is a first mask material, is formed on the stopper film 13. Using an inversion mask (not shown), the first resist 14 is patterned. Thus, a mask is formed of the first resist 14. The thickness of the stopper film 13 may be set to be greater than the thickness of the first resist 14. The stopper film 13 is effective if its thickness is, e.g. 1.1 times as large as the thickness of the first resist 14. Preferably, the thickness of the stopper film 13 should be twice or more as large as the thickness of the first resist 14.

Figure 1B:
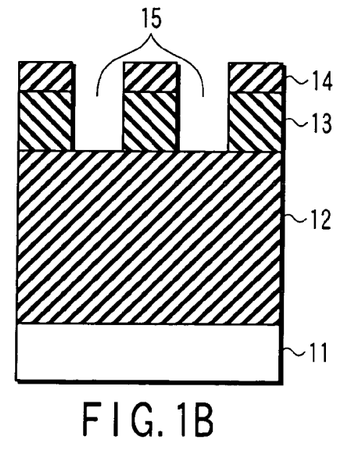

Subsequently, as shown in FIG. 1B, using the patterned first resist 14 as a mask, the stopper film 13 is etched to form trenches 15. Preferably, the etching selectivity of the stopper film 13 to the insulation film 12 should be, e.g. 10 or more. Under this condition, the precision of etching is enhanced when the trenches 15 are formed in the stopper film 13, and the trenches 15 with a good shape can be formed. Thereafter, a second resist 16, which is a second mask material, is coated over the entire surface of the resultant structure.

Figure 1C:
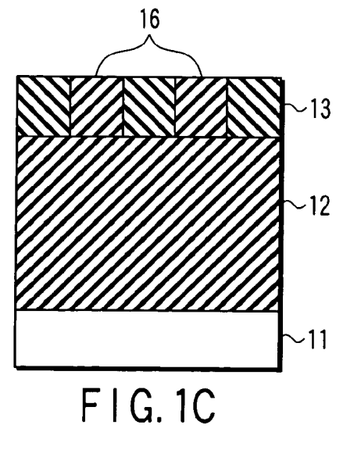

Then, as shown in FIG. 1C, the second resist 16 is planarized by, e.g. CMP (Chemical Mechanical Polishing), thereby to remove that portion of the second resist 16, which is located outside the trenches 15 in the stopper film 13.

Figure 1D:
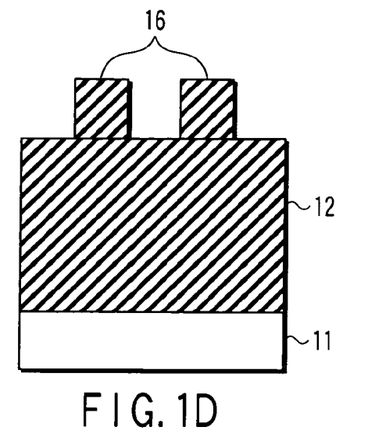
Figure 1E:
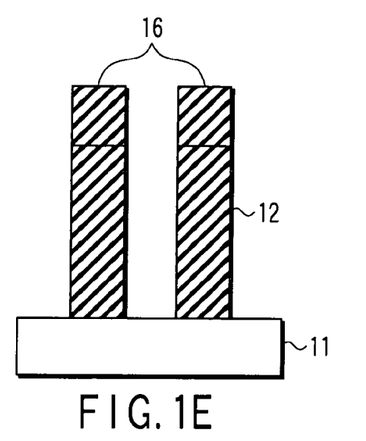

After that, as shown in FIG. 1D, the stopper film 13 is removed, and a pattern of the second resist 16 is formed. Since the thickness of the stopper film 13 is set to be greater than that of the photosensitive first resist 14, the thickness of the second resist 16 can be made greater than that of the first resist 14. Using the pattern of the second resist 16 as a mask, the insulation film 12 is etched. Thereby, a trench for wiring is formed, as shown in FIG. 1E.

Figure 1F:
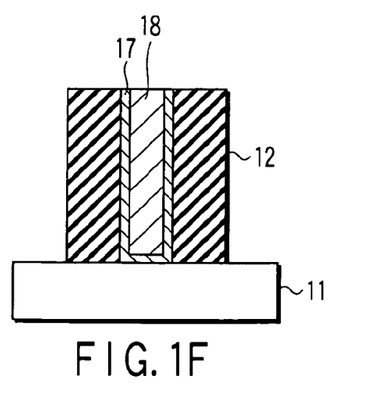

Subsequently, a TaN film 17 and a Cu film are formed in the trench. Then, using electrolytic plating, the trench is filled with a Cu film. At last, those portions of Ta and Cu, which are located outside the trench, are removed by CMP. Thus, as shown in FIG. 1F, a Cu wiring line 18 is formed by a damascene process.

FIG. 2A to FIG. 2E show a modification of the embodiment shown in FIGS. 1A to 1F. The parts common to those in FIGS. 1A to 1F are denoted by like reference numerals.

Figure 2A:
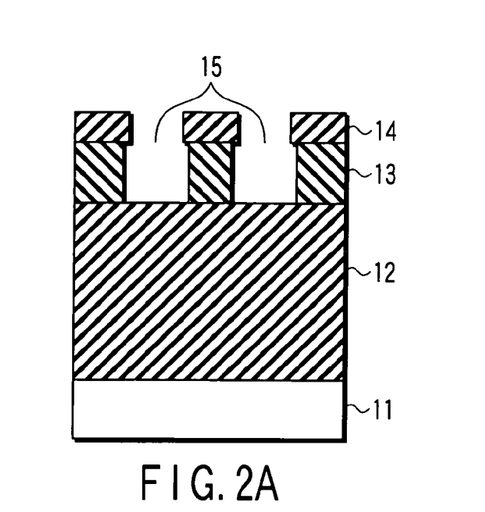

As is shown in FIG. 2A, a first resist 14 is patterned using an inversion mask. Using the first resist 14 as a mask, a stopper film 13 is subjected to anisotropic etching, and then to wet washing. Thus, trenches 15 are formed. The stopper film 13 is etched such that the pattern of the stopper film 13 may be thinner than the pattern of the first resist 14. Accordingly, the width of the trench 15 becomes greater than that of the trench 15 shown in FIG. 1B.

Thereafter, a second resist 16 is coated over the entire surface of the resultant structure. That portion of the second resist 16, which is located outside the trenches 15, is removed by CMP.

Figure 2B:
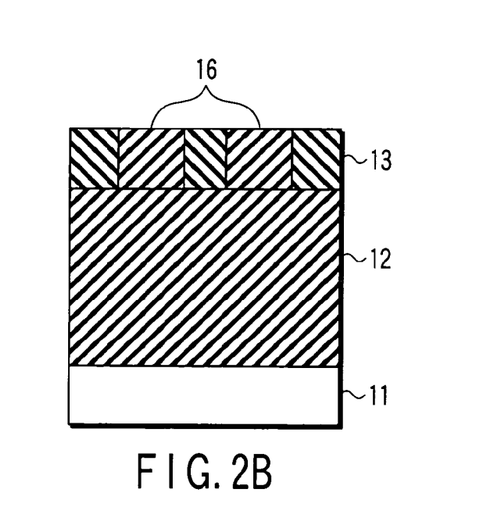

Thus, as shown in FIG. 2B, the trenches 15 is filled with the second resist 16.

Figure 2C:
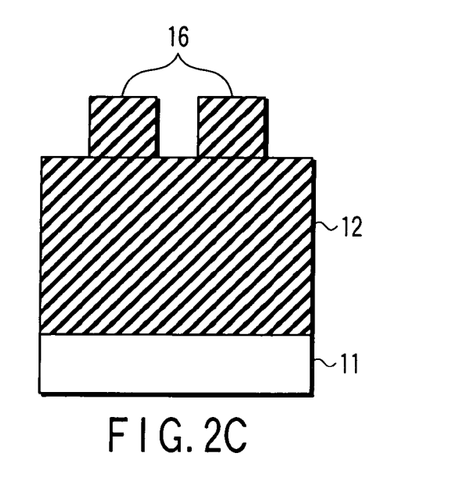

In a fabrication step illustrated in FIG. 2C, the stopper film 13 is removed, and a pattern of the second resist 16, which has a space pattern with a smaller width than the space of the pattern of the first resist 14, is formed.

Figure 2D:
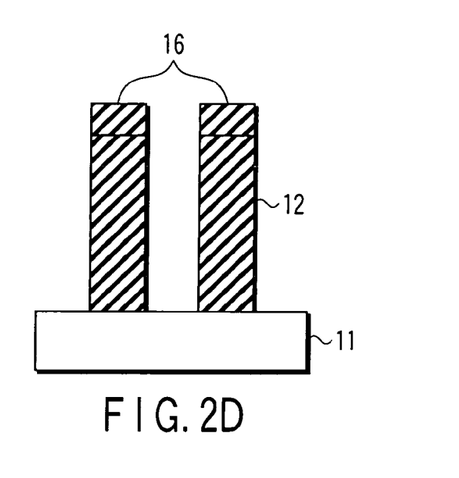

Then, as shown in FIG. 2D, using the second resist 16 as a mask, the insulation film 12 is etched. In this case, the space in the second resist 16 is formed in advance so as to have a less dimension than a final dimension. Thus, even if the pattern itself of the second resist 16 is thinned during the etching, that is, even if the width of the space increases, a trench with a desired final dimension can be formed.

Figure 2E:
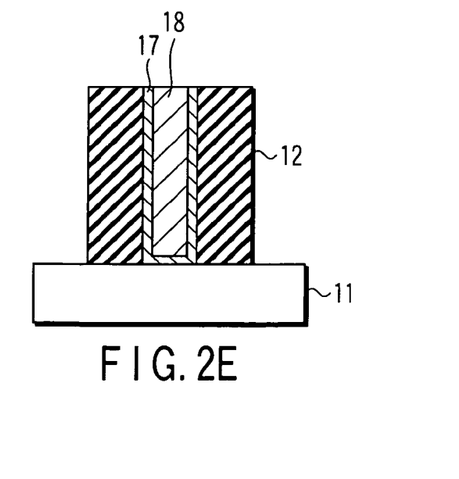

Subsequently, a TaN film 17 and a Cu film are formed in the trench. Then, using electrolytic plating, the trench is filled with a Cu film. At last, those portions of Ta and Cu, which are located outside the trench, are removed by CMP. Thus, as shown in FIG. 2E, a Cu wiring line 18 is formed by a damascene process.

Some examples of the invention based on the above embodiment will now be described in detail.

First Example

FIG. 3A to FIG. 3F illustrate a manufacturing method of a semiconductor device according to a first example of the invention.

Figure 3A:
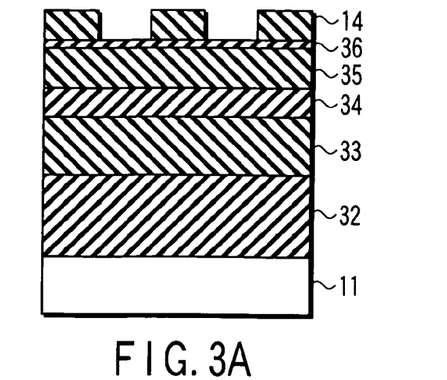

In FIG. 3A, a TEOS film 32 with a thickness of 0.5 μm is formed on an Si substrate 11. A porous SiCH film 33 with a thickness of 0.3 μm and a dielectric constant k=2.7 is formed on the TEOS film 32. An $SiH_4$ film 34 with a thickness of 0.1 μm is formed on the SiCH film 33. A TEOS film 35 with a thickness of 0.3 μm is formed on the $SiH_4$ film 34.

The insulation film is not limited to the SiCH film 33, and may be at least one insulation film of, e.g. $SiO_2$, SiN, SiC, SiCN, SiCO, SiCH and SiCNH. The stopper film is not limited to the TEOS film 35, and may be at least one insulation film of $SiO_2$, SiN, SiC, SiCN, SiCO, SiCH and SiCNH, or a conductive film including at least one element of Ti, Ta, Al, Cu, Mg and W. In this case, the stopper may be a combination having a etching selectivity of 10 or more, relative to the insulation film.

An organic anti-reflection coating film (hereinafter "ARC") 36 with a thickness of 0.1 μm is coated on the TEOS film 35. A first resist 14 with a thickness of 0.18 μm is coated on the ARC 36. Then, using an exposure device with an ArF light source, a line-and-space pattern comprising lines each having a width 90 nm and spaces each having a width of 90 nm is formed in the first resist 14, as shown in FIG. 3A. Thus, the focus margin is exactly set at a DOF (depth of focus)=0.4 µm. In this case, the lines and spaces are patterned using an inversion mask.

Figure 3B:
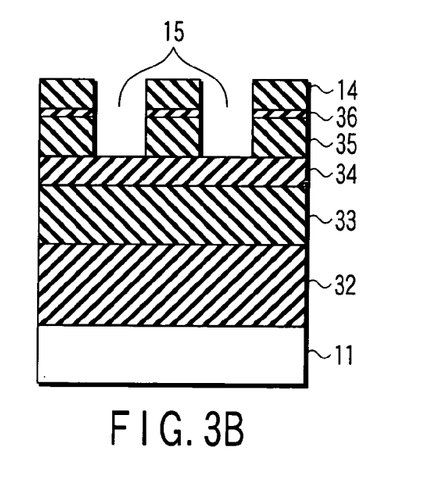

As is shown in FIG. 3B, using the pattern of the first resist 14 as a mask, the ARC 36 with the thickness of 0.1 µm and the TEOS film 35 with the thickness of 0.3 µm are etched. Although the first resist 14 is a photoresist, it may be a non-photosensitive resist.

The TEOS film 35 with the thickness of 0.3 µm is subjected to anisotropic etching (e.g. RIE) under the condition of a $C_4F_8$-based gas. In this case, since the E/R ratio between the TEOS film 35 and first resist 14 is 5 or more, the thickness of the first resist 14, whose initial thickness is 0.18 µm, decreases to 0.1 µm or less. However, the first resist 14 is not relatively easily etched, and the TEOS film 35 is easily etched. Since the etching selectivity between the TEOS film 35 and $SiH_4$ film 34 is, e.g. 10 or more, an adequate precision in etching can be obtained and trenches 15 with a good shape can be formed.

The remaining first resist 14 is removed by ashing, and the trenches 15 with L/S=90/90 nm are formed (S: the width of each trench).

Figure 3C:
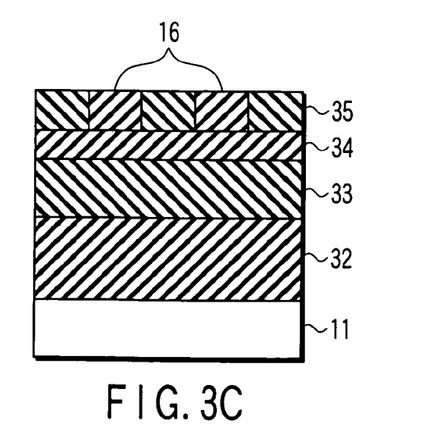

Subsequently, as shown in FIG. 3C, a thermal-crosslinkable second resist 16 with a thickness of 0.2 µm is coated and buried in the trenches 15 in the TEOS film 35. After the second resist 16 is thermally cross-linked, resist CMP is executed. All the resist, except the resist portion in the trenches 15, are removed by the CMP, but the TEOS film 35 is not polished. The etching selectivity of the second resist 16 to the stopper film, i.e. the TEOS film 35, is preferably 10 or more.

If the remaining first resist 14 is not removed by ashing, the remaining first resist 14 is removed by the CMP. In this case, the etching rate of the first resist 14 is almost the same as, or preferably larger than that of the second resist 16.

Therefore, the etching selectivity of the second resist 16 to the first resist 14 is about 1 or less. If the etching selectivity of the second resist 16 to the first resist 14 is more than 2, the first resist 14 may remain after CMP. Then, the etching selectivity of the second resist 16 to the first resist 14 is preferably 2 or less.

The second resist 16 may be formed of an organic film (e.g. an organic material mainly comprising PAE (polyanilate)), or a conductor including at least one element of Ti, Ta, Cu, Al, W, and Mg, or an insulator including, as a main component, at least one of $SiO_2$, SiN, SiC, SiCN, SiCO, SiCH and SiCNH.

Figure 3D:
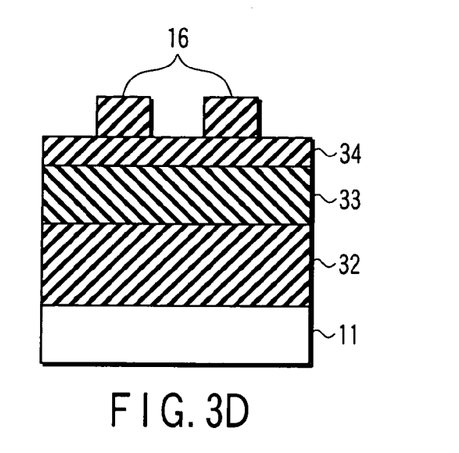

Then, as shown in FIG. 3D, only the TEOS film 35 is removed by RIE using a $C_4F_8$-based gas. Thereby, a resist pattern with L/S=90/90 nm and a thickness of 0.3 µm is formed of the second resist 16. The thickness of this resist pattern is greater than the initial thickness of the first resist 14.

Figure 3E:
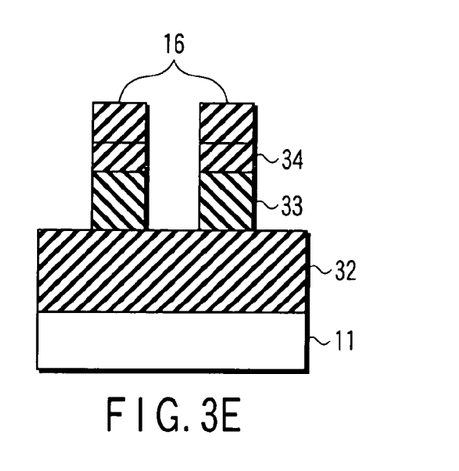

Subsequently, as shown in FIG. 3E, using the pattern of the second resist 16 as a mask, the $SiH_4$ film 34 and the SiCH film 33 with a dielectric constant k=2.7 are etched. The thickness of the remaining second resist 16 after the etching is 0.05 µm. By removing the remaining second resist 16 by ashing, a trench with L/S=90/90 nm and a depth of 0.4 µm can be formed. The trench is etched substantially vertical, with a good shape.

Figure 3F:
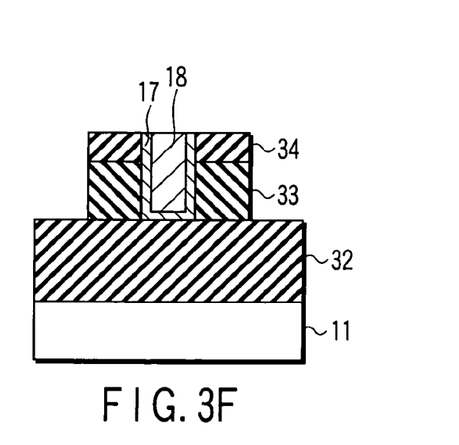

Thereafter, a TaN film 17 and a Cu film are formed in the trench. Then, using electrolytic plating, the trench is filled with a Cu film with a thickness of 700 nm. At last, those portions of Ta and Cu, which are located outside the trench, are removed by CMP. Thus, as shown in FIG. 3F, a Cu wiring line 18 is formed by a damascene process.

According to the first example, using the first resist 14 and the TEOS film 35 that serves as the stopper film, a mask having an inverted pattern, relative to the first resist 14, is formed by the second resist 16 that is thicker than the first resist 14. Thus, using the mask of the second resist 16, the $SiH_4$ film 34 and the SiCH film 33 are etched. Thereby, the thick $SiH_4$ film 34 and SiCH film 33 can sufficiently be etched, and a trench with a good shape can be formed.

Since the etching selectivity between the $SiH_4$ film 34 that is the insulation film and the TEOS film 35 that is the stopper film is 10 or more, an adequate precision in etching can be obtained and trenches 15 with a good shape can be formed.

Furthermore, the second resist 16 is planarized by resist CMP. Compared to the case of removing the resist by, e.g. etching, the planarity of the resist can be enhanced and a good pattern can be formed.

Second Example

FIG. 4A to FIG. 4F illustrate a manufacturing method of a semiconductor device according to a second example of the invention.

Figure 4A:
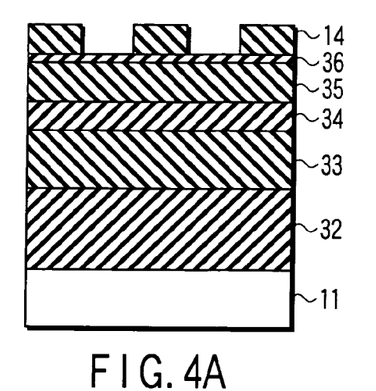

In FIG. 4A, a TEOS film 32 with a thickness of 0.5 µm is formed on an Si substrate 11. A porous SiCH film 33 with a thickness of 0.3 µm and a dielectric constant k=2.7 is formed on the TEOS film 32. An $SiH_4$ film 34 with a thickness of 0.1 µm is formed on the SiCH film 33. A TEOS film 35 with a thickness of 0.3 µm is formed on the $SiH_4$ film 34.

The insulation film is not limited to the SiCH film 33, and may be at least one insulation film of, e.g. $SiO_2$, SiN, SiC, SiCN, SiCO, SiCH and SiCNH. The stopper film is not limited to the TEOS film 35, and may be at least one insulation film of $SiO_2$, SiN, SiC, SiCN, SiCO, SiCH and SiCNH, or a conductive film including at least one element of Ti, Ta, Al, Cu, Mg and W. In this case, the stopper may be a combination having a etching selectivity of 10 or more, relative to the insulation film.

An organic ARC 36 with a thickness of 0.1 µm is coated on the TEOS film 35. A first resist 14 with a thickness of 0.18 µm is coated on the ARC 36. Then, using an exposure device with an ArF light source, a line-and-space pattern comprising lines each having a width of 90 nm and spaces each having a width of 90 nm is formed in the first resist 14, as shown in FIG. 4A. Thus, the focus margin is exactly set at a DOF=0.4 µm. In this case, the lines and spaces are patterned using an inversion mask.

Figure 4B:
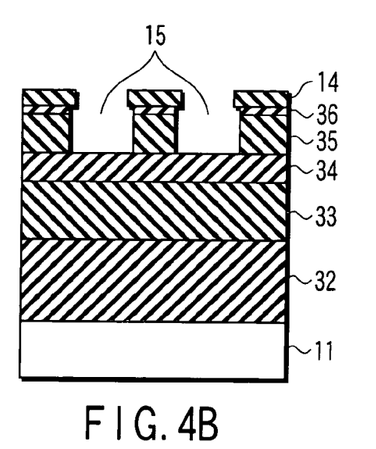

As is shown in FIG. 4B, using the pattern of the first resist 14 as a mask, the ARC 36 with the thickness of 0.1 µm and the TEOS film 35 with the thickness of 0.3 µm are etched. Although the first resist 14 is a photoresist, it may be a non-photosensitive resist.

The TEOS film 35 with the thickness of 0.3 µm is subjected to anisotropic etching (e.g. RIE) under the condition of a $C_4F_8$-based gas. In this case, the E/R ratio between the TEOS film 35 and first resist 14 is 5 or more. Thus, the thickness of the first resist 14, whose initial thickness is 0.18 µm, decreases to 0.1 µm or less. However, the first resist 14 is not relatively easily etched, and the TEOS film 35 is easily etched.

Then, in order to remove a residual after the etching, the resultant structure is subjected to wet washing using, e.g. an ammonium fluoride-based liquid. In this case, the trenches 15 in the TEOS film 35 are etched and widened by, e.g. about 5 nm, and the trenches with L/S=85/95 nm are formed, as shown in FIG. 4B. Further, the remaining first resist 14 is removed by ashing. In the meantime, wet washing may be performed after the ashing.

Subsequently, a thermal-crosslinkable second resist 16 with a thickness of, e.g. 0.2 μm is coated and buried in the trenches 15 in the TEOS film 35. Then, the second resist 16 is thermally cross-linked.

Figure 4C:
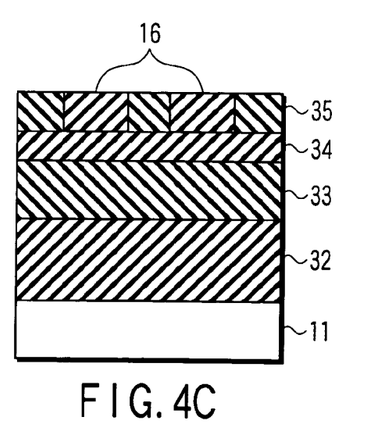

As is shown in FIG. 4C, the second resist 16 is planarized by CMP. All the resist, except the resist portion in the trenches 15, are removed by the CMP, but the TEOS film 35 is not polished.

The second resist 16 may be formed of an organic film (e.g. an organic material mainly comprising PAE (polyanilate)), or a conductor including at least one element of Ti, Ta, Cu, Al, W, and Mg, or an insulator including, as a main component, at least one of $SiO_2$, SiN, SiC, SIGN, SiCO, SiCH and SiCNH.

Figure 4D:
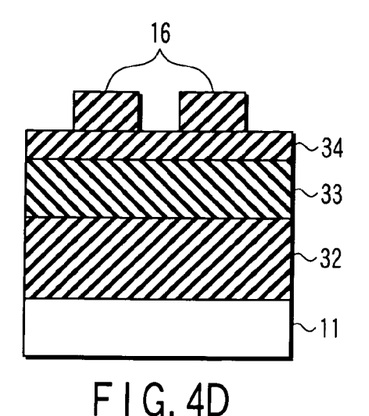

Then, as shown in FIG. 4D, RIE using, e.g. $C_4F_8$-based gas is executed to remove only the TEOS film 35, while the second resist 16 is left. Thereby, a resist pattern with L/S=95/85 nm and a thickness of 0.3 μm is formed. The thickness of this resist pattern is greater than the initial thickness of the first resist 14.

Figure 4E:
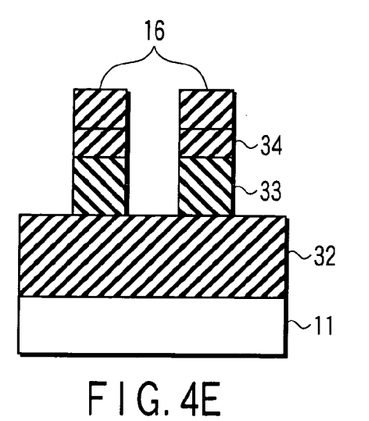

Subsequently, as shown in FIG. 4E, using the pattern of the second resist 16 as a mask, the $SiH_4$ film 34 and the SiCH film 33 with a dielectric constant k=2.7 are etched. The thickness of the remaining second resist 16 after the etching is 0.05 μm. The remaining second resist 16 is removed by ashing, and a residual after the etching is further removed by wet washing using an ammonium fluoride-based liquid. In this case, the $SiH_4$ film 34 and the SiCH film 33 are etched by about 5 nm and the space is widened. Thus, a trench with L/S=90/90 nm and a depth of 0.4 μm can be formed. The trench is etched substantially vertical, with a good shape.

Figure 4F:
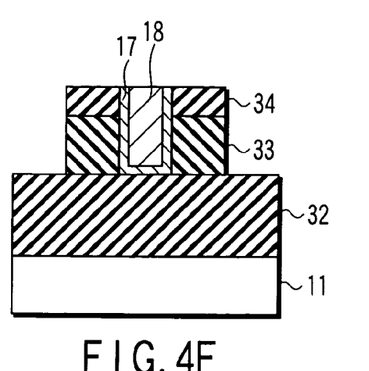

Thereafter, a TaN film 17 and a Cu film are formed in the trench. Then, using electrolytic plating, the trench is filled with a Cu film with a thickness of 700 nm. At last, those portions of Ta and Cu, which are located outside the trench, are removed by CMP. Thus, as shown in FIG. 4F, a Cu wiring line 18 is formed by a damascene process.

According to the second example, the same advantageous effects as with the first example can be obtained.

In order to clarify the advantageous effects of the first and second examples, comparative examples are described below. In the comparative examples, trenches are formed by methods that are different from the methods of manufacturing the semiconductor devices according to the first and second examples.

First Comparative Example

Figure 5A:
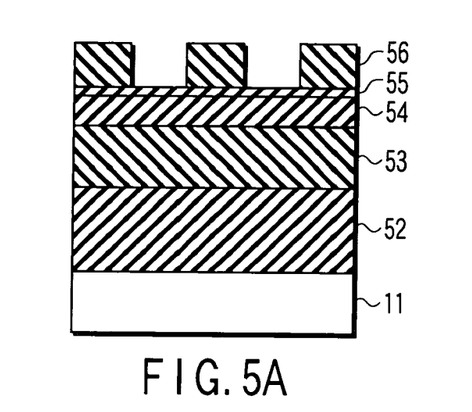

In FIG. 5A, a TEOS film 52 with a thickness of 0.5 μm is formed on an Si substrate 11. An SiCH film 53 with a thickness of 0.3 μm and a dielectric constant k=2.7 is formed on the TEOS film 52. An $SiH_4$ film 54 with a thickness of 0.1 μm is formed on the SiCH film 53. An organic ARC 55 with a thickness of 0.1 μm is coated on the $SiH_4$ film 54. A resist 56 with a thickness of 0.18 μm is coated on the ARC 55. Then, using an exposure device with an ArF light source, a line-and-space pattern comprising lines each having a width of 90 nm and spaces each having a width of 90 nm is formed in the resist 56.

Figure 5B:
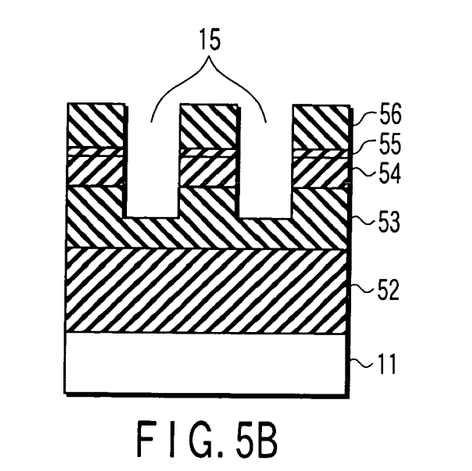

As is shown in FIG. 5B, using this resist pattern as a mask, the ARC 55 with the thickness of 0.1 μm and the $SiH_4$ film 54 are etched.

Figure 5C:
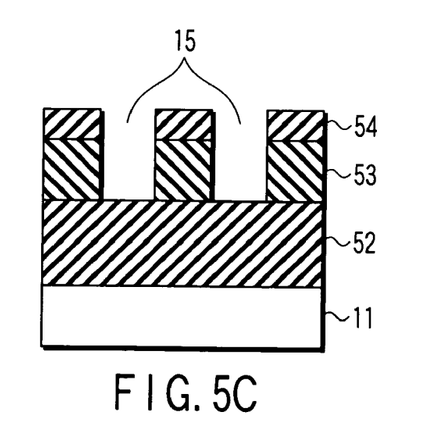
Figure 5D:
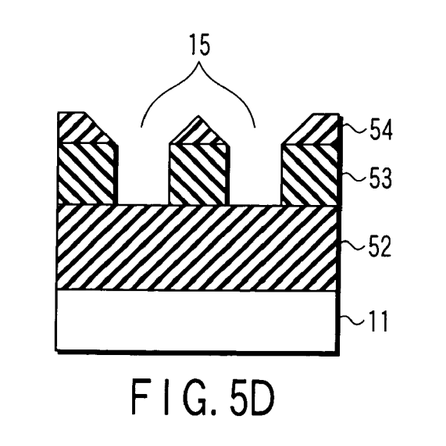

Then, as shown in FIG. 5C and FIG. 5D, the SiCH film 53 with the thickness of 0.3 μm and the $SiH_4$ film 54 with the thickness of 0.1 μm are subjected to anisotropic etching. In this case, the thickness of the resist 56, whose initial thickness is 0.18 μm, decreases to 0.1 μm or less. Even if the etching selectivity between the resist 56 and the SiCH film 53 and $SiH_4$ film 54 is taken into account, the thickness of the resist, relative to the initial thickness, is deficient by 0.15 μm. Consequently, in the first comparative example, as shown in FIG. 5C and FIG. 5D, the trenches 15 cannot be etched with a good shape.

Second Comparative Example

In a second comparative example, compared to the first comparative example, the thickness of the resist 56 was increased to 0.38 μm in order to compensate for the deficiency in thickness of the resist. In this case, however, even if an attempt was made to form a pattern with L/S=90 nm/90 nm by ArF exposure, DOF=0 μm and there was no focus margin. Most of the resist pattern fell and a pattern could not be formed.

Third Comparative Example

Figure 6A:
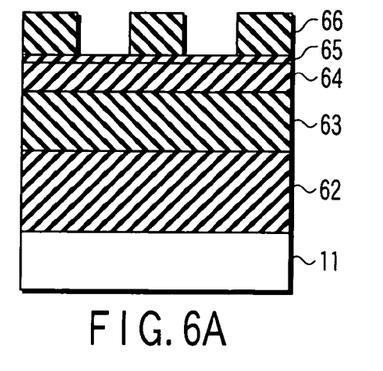

FIG. 6A to FIG. 6D show a third comparative example. As shown in FIG. 6A, a TEOS film 62 with a thickness of 0.5 μm is formed on an Si substrate 11. An organic insulation film 63 with a thickness of 0.3 μm and a dielectric constant k=2.7 is formed on the TEOS film 62. An $SiH_4$ film 64 with a thickness of 0.1 μm is formed on the insulation film 63. An organic ARC 65 with a thickness of 0.1 μm is coated on the $SiH_4$ film 64. A resist 66 with a thickness of 0.18 μm is coated on the ARC 65. Then, using an exposure device with an ArF light source, a line-and-space pattern comprising lines each having a width of 90 nm and spaces each having a width of 90 nm is formed in the resist 66.

Figure 6B:
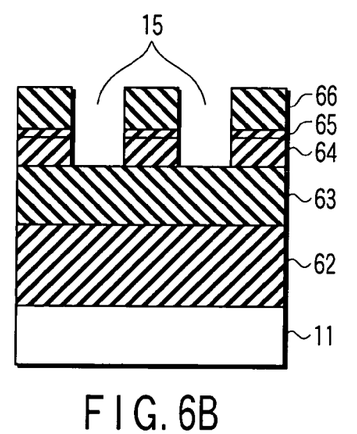

As is shown in FIG. 6B, using the pattern of the resist 66 as a mask, the ARC 65 with the thickness of 0.1 μm and the $SiH_4$ film 64 with the thickness of 0.1 μm are etched.

In this case, the thickness of the resist 66, whose initial thickness is 0.18 μm, decreases to 0.1 μm or less. However, the $SiH_4$ film 64 with the thickness of 0.1 μm can easily be anisotropically etched under the condition of a $C_4F_8$-based gas.

Figure 6C:
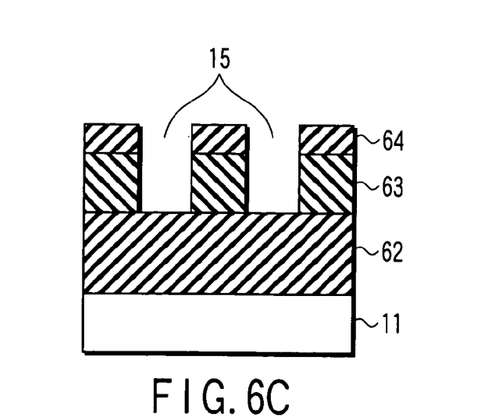

Subsequently, as shown in FIG. 6C, using the $SiH_4$ film 64 as a mask, the organic insulation film 63 with the dielectric constant k=2.7 is etched using a $NH_3$-based gas. The $SiH_4$ film 64 is hardly etched by the $NH_3$-based gas. The resist 66 can completely be etched by the $NH_3$-based gas.

Figure 6D:
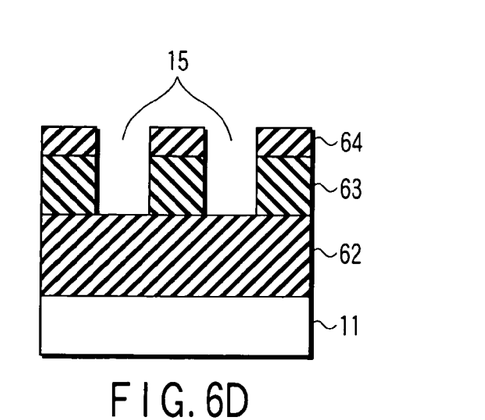

Then, as shown in FIG. 6D, in order to remove a residual after the etching, the resultant structure is subjected to wet washing using an ammonium fluoride-based liquid. In this case, the $SiH_4$ film 64 and the organic insulation film 63 are etched by about 5 nm, and the spaces are widened. Thus, trenches with L/S=85/95 nm and a depth of 0.3 μm are formed. In this comparative example, trenches with desired final dimensions of L/S=90/90 nm could not be formed. In the case where wiring lines are formed in the trenches with L/S=85/95 nm, the capacitance between lines would increase and the propagation speed of signals in the wiring lines would decrease.

Fourth Comparative Example

In order to solve the problem of the third comparative example, a line-and-space pattern comprising lines each having a width of 95 nm and spaces each having a width of 85 nm was formed in the resist using an exposure device with an ArF light source. In this case, however, DOF=0.15 μm or less and the focus margin was deficient, and it was difficult to form a resist pattern.

As has been described above, according the embodiment of the invention and the first and second examples of the invention, unlike the first to fourth comparative examples, the insulation film can be etched to have desired dimensions, for example, by forming the second resist that is thicker than the first resist.

According to one aspect of the present invention, there can be provided a method of manufacturing a semiconductor device, wherein an insulation film can be etched to have desired dimensions by using a mask.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
    forming an insulation film on a semiconductor substrate;
    forming a stopper film on the insulation film, the stopper film having a large etching selectivity relative to the insulation film and having a first film thickness;
    forming a first mask material on the stopper film, the first mask material having a second film thickness that is less than the first film thickness;
    forming a first mask by patterning the first mask material using an inversion mask having a final dimension;
    forming an opening portion wider than the first mask by etching the stopper film using the first mask, thereby performing a process causing the stopper film to have a pattern thinner than the first mask;
    filling the opening portion with a second mask material;
    forming a second mask of the second mask material by removing the first mask and the stopper film, the second mask having a thickness which is greater than the second film thickness; and
    etching the insulation film deeper than the first film thickness using the second mask.

2. The method according to claim 1, further comprising removing a portion of the second mask material, which is located outside the opening portion, by polishing after the filling of the opening portion and before the formation of the second mask.

3. The method according to claim 1, wherein the second mask material is one of a resist, an organic film, a conductor including at least one element of Ti, Ta, Cu, Al, W, and Mg, and an insulator including, as a main component, at least one of $SiO_2$, SiN, SiC, SiCN, SiCO, SiCH and SiCNH.

4. The method according to claim 1, wherein the stopper film is one of an insulation film including at least one of $SiO_2$, SiN, SiC, SiCN, SiCO, SiCH and SiCNH, and a conductive film including at least one element of Ti, Ta, Al, Cu, Mg and W.

5. The method according to claim 1, wherein the etching selectivity of the stopper film to the insulation film is 10 or more.

6. The method according to claim 1, further comprising forming, following the etching of the insulation film, a metal wiring line in a trench that is formed by the etching of the insulation film.

7. The method according to claim 3, wherein the organic film is an organic substance including polyanilate.

8. The method according to claim 1, wherein the first mask material is one of a photoresist and a non-photosensitive resist.

9. The method according to claim 1, wherein the etching of the insulation film comprises etching a region of the insulation film, which is covered by the first mask, by using the second mask.

10. The method according to claim 6, wherein the metal wiring line is a Cu wiring line.

11. The method according to claim 1, wherein the insulation film includes at least one of $SiO_2$, SiN, SiC, SiCN, SiCO, SiCH and SiCNH.

12. The method according to claim 11, wherein the insulation film includes an SiCH film with a dielectric constant k=2.7.

13. The method according to claim 1, wherein a width of the opening portion is greater than a width of an opening in the first mask, which is made to form the opening portion.

14. The method according to claim 13, wherein the etching of the stopper film comprises anisotropic etching and wet etching that follows the anisotropic etching.

15. The method according to claim 1, further comprising forming an anti-reflection coating film after the formation of the stopper film and before the formation of the first mask material.

16. The method according to claim 2, wherein the etching selectivity of the second mask to the stopper film is 10 or more.

17. The method according to claim 2, wherein the etching selectivity of the second mask to the first mask is 2 or less.

18. A method of manufacturing a semiconductor device, comprising:
    forming a stopper film on an insulation film, the stopper film having a large etching selectivity relative to the insulation film and having a first film thickness;
    forming a first mask material on the stopper film, the first mask material having a second thickness that is less than the first film thickness;
    forming a first mask having a first opening portion with a first width by patterning the first mask material using an inversion mask having a final dimension;
    forming a second opening portion with a second width that is wider than the first width by etching the stopper film using the first mask, thereby performing a process causing the stopper film to have a pattern thinner than the first mask;
    filling the second opening portion with a second mask material;
    forming a second mask, which is an inversion pattern of the first mask, of the second mask material by removing the first mask and the stopper film, the second mask having a thickness which is greater than the second film thickness; and
    etching the insulation film deeper than the first film thickness using the second mask and forming a pattern having a third opening portion with a width that is substantially identical with the first width.

19. The method according to claim 18, wherein the insulation film includes TEOS film formed on a semiconductor substrate and an insulation film formed by using $SiH_4$ as a main source gas formed on the TEOS film.

20. The method according to claim 18, wherein an anti-reflection coating film is formed on the stopper film and a first mask material is formed on the anti-reflection coating film.

* * * * *